(12) United States Patent
Xu et al.

(10) Patent No.: US 9,196,640 B2
(45) Date of Patent: Nov. 24, 2015

(54) ARRAY SUBSTRATE WITH A GATE DRIVER ON ARRAY (GOA) CIRCUIT AND DISPLAY DEVICE

(71) Applicant: BOE TECHNOLOGY GROUP CO., LTD., Beijing (CN)

(72) Inventors: Chao Xu, Beijing (CN); Heecheol Kim, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/139,834

(22) Filed: Dec. 23, 2013

(65) Prior Publication Data

US 2014/0175446 A1    Jun. 26, 2014

(30) Foreign Application Priority Data

Dec. 24, 2012 (CN) .......................... 2012 1 0568716

(51) Int. Cl.
| | |
|---|---|
| H01L 29/12 | (2006.01) |
| H01L 29/10 | (2006.01) |
| H01L 29/18 | (2006.01) |

(Continued)

(52) U.S. Cl.
CPC ........ *H01L 27/1255* (2013.01); *H01L 27/1259* (2013.01)

(58) Field of Classification Search
CPC ............ H01L 27/1259; H01L 27/1255; H01L 27/14643; H01L 27/12; H01L 27/0207; H01L 27/088; H01L 29/41733; G09G 3/3677
USPC ............ 257/71, 59, 88, 98, 100, 43; 438/155, 438/149, 34
See application file for complete search history.

(56) References Cited

U.S. PATENT DOCUMENTS

| | | | | |
|---|---|---|---|---|
| 5,932,892 | A | * | 8/1999 | Hseuh et al. ..................... 257/59 |
| 2005/0173703 | A1 | * | 8/2005 | Lebrun ........................... 257/59 |

(Continued)

FOREIGN PATENT DOCUMENTS

| | | |
|---|---|---|
| CN | 101978504 A | 2/2011 |
| CN | 102681276 A | 9/2012 |

(Continued)

OTHER PUBLICATIONS

First Office Action for corresponding Chinese Patent Application No. 201210568716.2, 21 pages, (Oct. 8, 2014).

(Continued)

*Primary Examiner* — Long K Tran
*Assistant Examiner* — Dzung Tran
(74) *Attorney, Agent, or Firm* — Blakely, Sokoloff, Taylor & Zafman LLP

(57) ABSTRACT

An array substrate includes a GOA circuit area and a display area, the GOA circuit area includes a TFT area and a lead-wire area, the display area includes a data line and a gate line. The GOA circuit area is provided with at least one first via and at least one second via, a data-line metal layer is disposed at the bottom of the at least one first via, and a gate-line metal layer is disposed at the bottom of the at least one second via. The GOA circuit area further includes a first electrode and a second electrode, the data-line metal layer is electrically connected to one electrode through the at least one first via, the gate-line metal layer is electrically connected to the other electrode through the at least one second via, such that a capacitor is formed between the first electrode and the second electrode.

10 Claims, 5 Drawing Sheets

(51) Int. Cl.
*H01L 33/00* (2010.01)
*H01L 27/12* (2006.01)

(56) References Cited

U.S. PATENT DOCUMENTS

| | | | |
|---|---|---|---|
| 2006/0033857 A1* | 2/2006 | Kim et al. | 349/54 |
| 2008/0117345 A1* | 5/2008 | Ishii et al. | 349/40 |
| 2009/0122213 A1 | 5/2009 | Ko et al. | |
| 2010/0045886 A1* | 2/2010 | Kwak | 349/40 |
| 2010/0051957 A1 | 3/2010 | Kim et al. | |
| 2010/0182306 A1 | 7/2010 | Kimura et al. | |
| 2011/0007049 A1 | 1/2011 | Kikuchi et al. | |
| 2012/0161820 A1 | 6/2012 | Koo et al. | |
| 2013/0056736 A1 | 3/2013 | Kim et al. | |

FOREIGN PATENT DOCUMENTS

| | | |
|---|---|---|
| EP | 2 565 877 A1 | 3/2013 |
| EP | 2 660 651 A1 | 11/2013 |
| WO | WO 2011/135873 A1 | 11/2011 |

OTHER PUBLICATIONS

European Patent Office Communication enclosing Extended European Search Report for corresponding European Patent Application No. 13198287.8, 7 pages, (May 19, 2014).

* cited by examiner

ARRAY SUBSTRATE WITH A GATE DRIVER ON ARRAY (GOA) CIRCUIT AND DISPLAY DEVICE

FIELD OF THE INVENTION

The present invention relates to a field of display technology, in particular, relates to an array substrate, a method for manufacturing the same, and a display device.

BACKGROUND OF THE INVENTION

In order to improve the display effect of a display device, more and more people start to pay attention to the design of a narrow frame for a display device. Especially for a spliced screen for large-screen outdoor display, a display device with a narrow frame can effectively reduce the width of a spliced gap in a spliced screen, thereby improving the overall display effect significantly.

In the prior art, manufacturing of a display with a narrow frame is generally realized by compressing a process margin to the limit, wherein a very important technology is a Gate Driver on Array (GOA) technology, which has achieved mass production. A gate switching circuit is integrated into an array substrate of a display panel by using the GOA technology, to form scan driving for the display panel, thus a gate driver integrated circuit may be omitted. This can not only reduce production cost in two aspects of material cost and manufacturing process, but also realize symmetry of two sides of a display panel and beautiful design of a narrow frame. The configuration of an existing display panel may be shown as in FIG. 1, wherein a GOA circuit 11 is symmetrically arranged at two sides of an effective display area 12. The microstructure of a portion of the GOA circuit 11 may be shown as in FIG. 2a. It can be clearly seen that, the area of the GOA circuit 11 may be further divided into a Thin Film Transistor (TFT) area 111, a capacitor area 112, and a lead-wire area 113 for connecting with the display area 12 to output a row-driving signal. The circuit structure of the capacitor area 112 may be shown as in FIG. 2b, wherein a transistor T in the TFT area 111 which is closest to an end of the capacitor area 112 is used for outputting a gate row-driving signal, and a source-drain metal layer and a gate layer which are connected to the transistor T are respectively taken as two ends of a capacitor C. FIG. 3 is a cross-sectional view of FIG. 2a taken along line A-A. It can be seen that, the lead-wire area 113 includes a gate layer 31, a gate-insulating layer 32, a resin layer 33, and a passivation layer 34. The capacitor C is formed between the source-drain metal layer located in the capacitor area 112 and the gate layer 31. The function of the capacitor C is to remove noise of the GOA circuit to ensure stability of the GOA circuit. However, the disadvantage thereof lies in that, in order to meet the specification of a capacitor, the length of the capacitor area 112 is generally made to be relatively large (as shown in FIG. 2a). Thus, the sire of the GOA circuit is limited, making it difficult for a frame of a display device to further narrow down.

SUMMARY OF THE INVENTION

An object of the present invention is to provide an array substrate, a method for manufacturing the same, and a display device, which do not need to specially provide a capacitor area in a GOA circuit area. Thus, the overall length of the GOA circuit area may be reduced, and the width of a frame of the display device is further reduced.

In order to achieve the above object, the following technical solutions are employed in the embodiments of the present invention:

An aspect of the embodiments of the present invention provides an array substrate. The array substrate includes a GOA circuit area and a display area, the GOA circuit area includes a TFT area for outputting a gate row-driving signal and a lead-wire area connected to the TFT area, and the display area includes a data line and a gate line which are arranged crosswise;

The GOA circuit area is provided with at least one first via and at least one second via, a data-line metal layer is disposed at the bottom of the at least one first via, and a gate-line metal layer is disposed at the bottom of the at least one second via;

The GOA circuit area further includes a first electrode and a second electrode, the data-line metal layer is electrically connected to one electrode of the first electrode and the second electrode through the at least one first via, and the gate-line metal layer is electrically connected to the other electrode of the first electrode and the second electrode through the at least one second via, such that a capacitor is formed between the first electrode and the second electrode.

Another aspect of the embodiments of the present invention provides a display device, and the display device includes the array substrate as described above.

Yet another aspect of the embodiments of the present invention provides a method for manufacturing an array substrate, the array substrate includes a GOA circuit area and a display area, the GOA circuit area includes a TFT area for outputting a gate row-driving signal and a lead-wire area connected to the TFT area, and the display area includes a data line and a gate line which are arranged crosswise; wherein the GOA circuit area further includes a first electrode and a second electrode, the method including:

Forming a resin layer having a first via on a substrate on which the TFT area is formed such that the first via penetrates through the resin layer to expose a data-line metal layer of the TFT area;

Forming a first electrode on the surface of the resin layer such that the first electrode is electrically connected to the data-line metal layer through the first via;

Forming a passivation layer having a second via on the substrate on which the first electrode is formed such that the second via penetrates through the passivation layer, the resin layer, and a gate-insulating layer of the TFT area to expose a gate-line metal layer of the TFT area; and Forming a second electrode on the surface of the passivation layer such that the second electrode is electrically connected to the gate-line metal layer through the second via to form a capacitor between the first electrode and the second electrode.

Still another aspect of the embodiments of the present invention provides a method for manufacturing an array substrate, the array substrate includes a GOA circuit area and a display area, the GOA circuit area includes a TFT area for outputting a gate row-driving signal and a lead-wire area connected to the TFT area, and the display area includes a data line and a gate line which are arranged crosswise; wherein the GOA circuit area further includes a first electrode and a second electrode, the method including:

Forming a resin layer having a second via on a substrate on which the TFT area is formed such that the second via penetrates through the resin layer and a gate-insulating layer of the TFT area to expose a gate-line metal layer of the TFT area:

Forming a first electrode on the surface of the resin layer such that the first electrode is electrically connected to the gate-line metal layer through the second via;

Forming a passivation layer having a first via on the substrate on which the first electrode is formed such that the first via penetrates through the passivation layer and the resin layer to expose a data-line metal layer of the TFT area; and Forming a second electrode on the surface of the passivation layer such that the second electrode is electrically connected to the data-line metal layer through the first via to form a capacitor between the first electrode and the second electrode.

The array substrate, the method for manufacturing the same, and the display device according to the embodiments of the present invention enable a capacitor to be formed between a first electrode and a second electrode provided in a GOA circuit area by the following technical measures: providing at least one first via and at least one second via in the GOA circuit area, and providing the first electrode and the second electrode in the GOA circuit area, wherein a data-line metal layer of a TFT area is disposed at the bottom of the at least one first via, and a gate-line metal layer of the TFT area is disposed at the bottom of the at least one second via; the data-line metal layer is electrically connected to one electrode of the first electrode and the second electrode through the at least one first via, and the gate-line metal layer is electrically connected to the other electrode of the first electrode and the second electrode through the at least one second via. As compared to an existing GOA circuit, the GOA circuit employed in the array substrate having such a configuration does not need to additionally provide a capacitor area. Thus, the overall length of the GOA circuit area is reduced, and the width of a frame of the display device is further reduced.

BRIEF DESCRIPTION OF THE DRAWINGS

In order to explain embodiments of the present invention or technical solutions in the prior art more clearly, drawings used in description of the embodiments or the prior art will be described briefly as follows. Obviously, the drawings described below are only some embodiments of the present invention, various modifications and variations can be applied to these drawings by a person skilled in the art without creative effort.

DETAILED DESCRIPTION OF THE EMBODIMENTS

Technical solutions according to embodiments of the present invention will be described clearly and completely with reference to the drawings of the embodiments. Obviously, the embodiments as described herein are only some embodiments of the present invention, but not all embodiments of the present invention. Based on the embodiments as described in the present invention, all other embodiments obtained through applying modification and variation to the present invention by a person having ordinary skill in the art without creative effort fall within the protection scope of the present invention.

Figure 1:
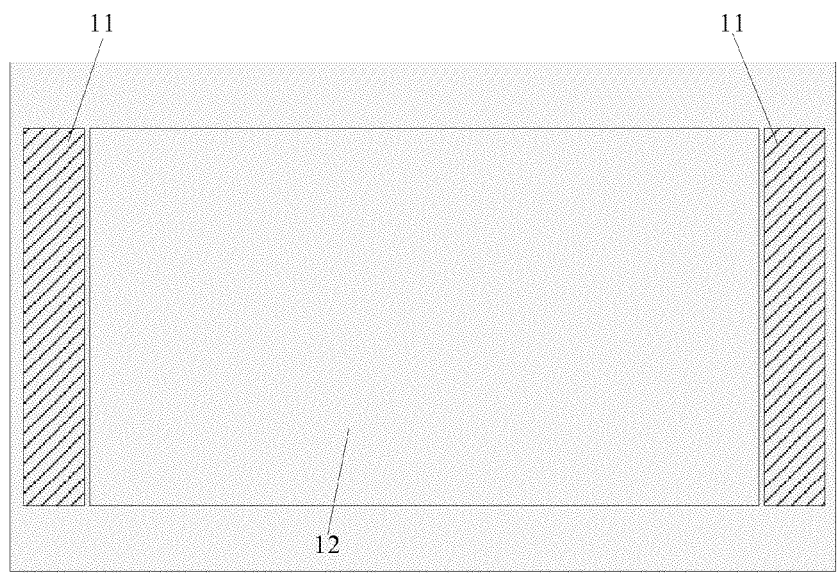
FIG. 1 is a schematic diagram illustrating the configuration of an existing array substrate having a GOA circuit.
Figure 2A:
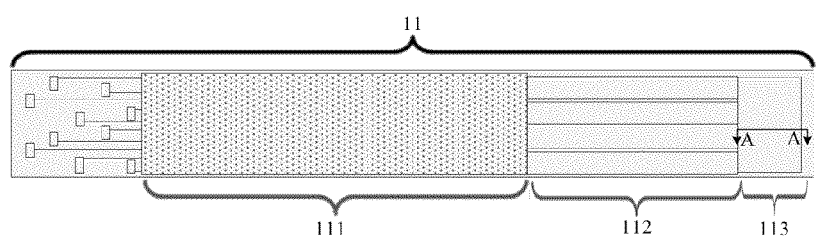
FIG. 2*a* is a schematic diagram illustrating the microstructure of the GOA circuit in an existing array substrate.
Figure 2B:
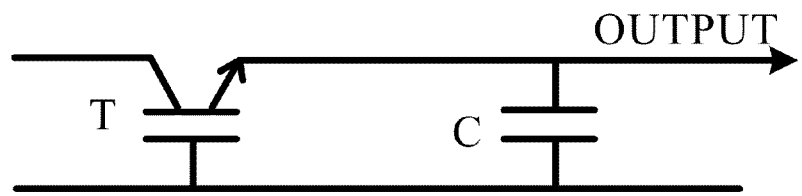
FIG. 2*b* is a schematic diagram illustrating the circuit structure of a capacitor area in the GOA circuit in an existing array substrate.
Figure 3:
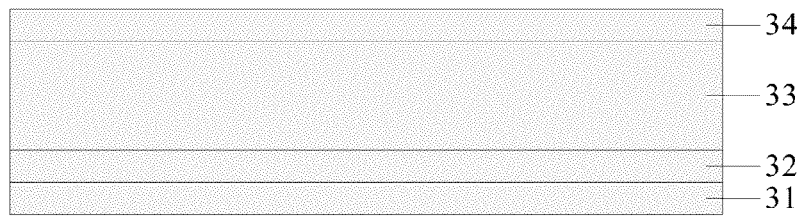
FIG. 3 is a sectional view of a lead-wire area of FIG. 2*a* taken along a line A-A.
Figure 4:
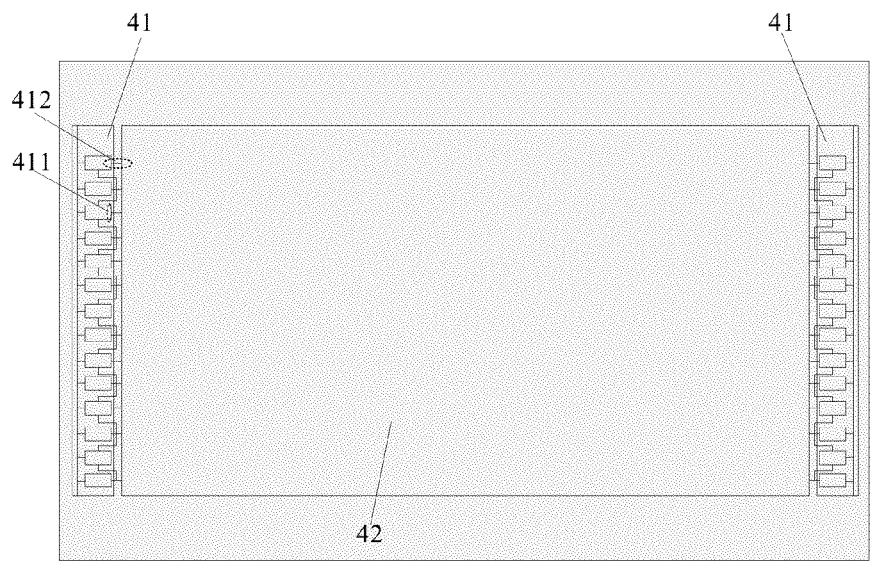
FIG. 4 is a schematic diagram illustrating the configuration of an array substrate according to an embodiment of the present invention.

One embodiment of the present invention provides an array substrate. As shown in FIG. 4, the array substrate includes a GOA circuit area 41 and a display area 42. The GOA circuit area 41 includes a TFT area 411 used for outputting a gate row-driving signal and a lead-wire area 412 connected to the TFT area, wherein the GOA circuit area 41 is further provided with a first electrode and a second electrode. The display area 42 includes a data line and a gate line which are arranged crosswise (not shown in FIG. 4) Furthermore, the first electrode and the second electrode may be arranged in the TFT area. It should be noted that, in an embodiment of the present invention, the GOA circuit area has at least one stage of shift register unit, wherein each stage of shift register unit has an output TFT for outputting a row-scanning signal corresponding to a row. The output TFT is connected to the lead-wire area 412. The row-scanning signal is outputted from the output TFT, and is outputted to the display area 42 of the array substrate through the lead-wire area 412 for driving a corresponding row of pixels in the display area 42 to turn on or turn off. An output signal of each stage of shift register unit also functions as a reset signal or a precharge signal of a preceding stage or following stage of shift register unit, thus progressive scanning of a display device is achieved.

Figure 5A:
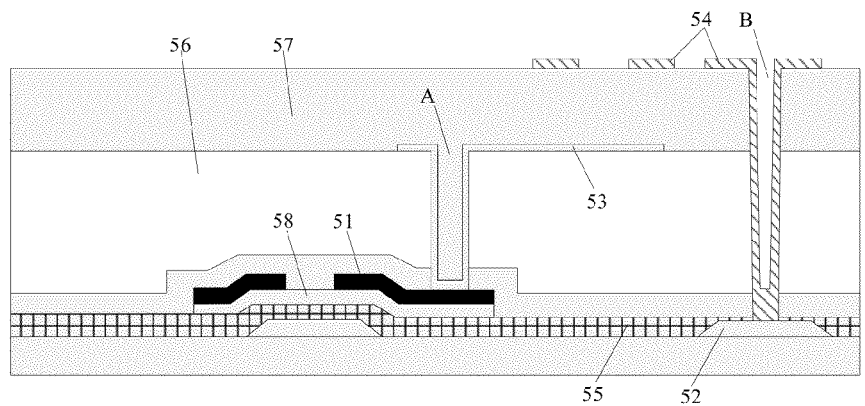
FIG. 5*a* is a schematic diagram illustrating the hierarchical structure of a TFT area of a GOA circuit area in an array substrate according to an embodiment of the present invention.

A hierarchical structure of the TFT area 411 used for outputting a gate row-driving signal may be shown as in FIG. 5*a*. The GOA circuit area 41 is provided with at least one first via A and at least one second via B. A data-line metal layer 51 is disposed at the bottom of the at least one first via A, and a gate-line metal layer 52 is disposed at the bottom of the at least one second via B.

In the TFT area 411 of the GOA circuit area 41, the data-line metal layer 51 is electrically connected to a first electrode 53 through the first via A, and the gate-line metal layer 52 is electrically connected to a second electrode 54 through the second via B, such that a capacitor is formed between the first electrode 53 and the second electrode 54.

The array substrate according to the present embodiment enables a capacitor to be formed between the first electrode and the second electrode by the following technical measures: providing the at least one first via and the at least one second via in a GOA circuit area, wherein the data-line metal layer of the TFT area is disposed at the bottom of the at least one first via, and the gate-line metal layer of the TFT area is disposes at the bottom of the at least one second via; the first electrode is electrically connected to the data-line metal layer through the at least one first via, and the second electrode is electrically connected to the gate-line metal layer through the at least one second via. As compared to an existing GOA circuit, the GOA circuit employed in the array substrate having such a configuration does not need to additionally provide a capacitor area. Thus, the length of the GOA circuit area is reduced effectively, and the width of a frame of the display device is further reduced.

Wherein, both the first electrode and the second electrode may be formed of transparent metal oxide material which has semiconductor characteristics. Examples of the transparent metal oxide material may include at least one of InGaZnO, InGaO, ITZO, and AlZnO.

The array substrate according to the present embodiment may be applied to a liquid crystal display device of Advanced-Super Dimensional Switching (ADS) type, High Resolution ADS (SADS) type, or the like. Using ADS technology, a multi-dimensional electric field is formed through an electric field generated by edges of slit electrodes in the same plane and an electric field generated between a slit-electrode layer and a plate-electrode layer, making liquid crystal molecules of all orientations between slit electrodes and right above slit electrodes in a liquid crystal cell rotate, thereby improving operation efficiency of liquid crystal molecules and increasing light transmission efficiency. The ADS technology may improve image quality of a TFT-LCD product, and has advantages of high resolution, high transmittance, low power consumption, wide viewing angle, high aperture ratio, low chromatic aberration, no push Mura, and the like. For different applications, there are a high transmittance I-ADS technology, a high aperture ratio H-ADS technology, a high resolution S-ADS technology, and the like as improvements of the ADS technology.

Whichever of the above liquid crystal display devices is employed, a color-film substrate and an array substrate which are formed by assembling are included. Wherein, both a common electrode and a pixel electrode are all formed on a surface of the array substrate.

In an array substrate of a display device of ADS type or SADS type, a common electrode and a pixel electrode may be arranged in different layers. Wherein, arrangement in different layers is relative to at least two patterns. At least two patterns arranged in different layers mean that, at least two patterns are respectively formed from at least two layers of transparent electrode film by using patterning processes. Arrangement in different layers relative to two patterns means that, one pattern is formed from each of two layers of transparent electrode film by using a patterning process. For example, a common electrode and a pixel electrode arranged in different layers mean that, a lower layer electrode is formed from a first layer of transparent electrode film by using a patterning process, and an upper layer electrode is formed from a second layer of transparent electrode film by using a patterning process; wherein, the lower layer electrode is the common electrode (or the pixel electrode), and the upper layer electrode is the pixel electrode (or the common electrode).

Furthermore, the display area 42 is also provided with a first transparent electrode and a second transparent electrode. The first transparent electrode and the first electrode may be formed in the same layer by a single patterning process, and the second transparent electrode and the second electrode may be formed in the same layer by a single patterning process. Wherein, arrangement in the same layer is also relative to at least two patterns, and arrangement in the same layer of at least two patterns means that at least two patterns are formed from the same thin film by a patterning process. In an embodiment of the present invention, the first transparent electrode may be a pixel electrode, and the second transparent electrode may be a common electrode or the first transparent electrode may be a common electrode, and the second transparent electrode may be a pixel electrode.

Figure 5B:
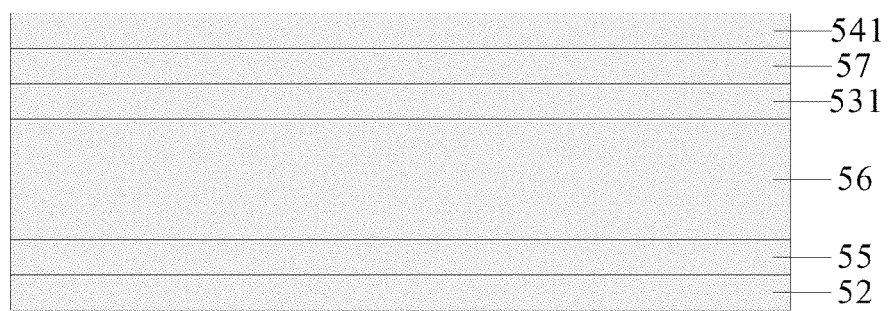
FIG. 5*b* is a schematic diagram illustrating the hierarchical structure of a lead-wire area of a GOA circuit area in an array substrate according to an embodiment of the present invention.

Furthermore, as shown in FIG. 5*b*, the lead-wire area 412 may further include:

A third electrode 531 integrally formed with the first electrode 53 of the TFT area 411 of the GOA circuit area 41 and a fourth electrode 541 integrally formed with the second electrode 54 of the TFT area 411 of the GOA circuit area 41 such that a capacitor is formed between the third electrode 531 and the fourth electrode 541 in a manner similar to the above.

As compared to the prior art, in the lead-wire area 412, the third electrode 531 is integrally formed with the first electrode 53, and the fourth electrode 541 is integrally formed with the second electrode 54. The third electrode 531 and the fourth electrode 541 may constitute a capacitor of the GOA circuit to remove noise from the circuit. Thus, by providing a capacitor in the lead-wire area, it can be further ensured that capacitance parameter in the GOA circuit also meets the design requirements without a specially provided capacitor area.

Furthermore, as shown in FIG. 5*a*, the TFT area 411 may further include:

A gate-insulating layer 55 and a semiconductor active layer 58 which are between the gate-line metal layer 52 and the data-line metal layer 51 of the TFT area 411, wherein the gate-insulating layer 55 is under the semiconductor active layer 58;

A resin layer 56 between the data-line metal layer 51 and the first electrode 53; and A passivation layer 57 between the first electrode 53 and the second electrode 54.

Furthermore, in the array substrate as shown in FIG. 5*a*, the first electrode 53 may be electrically connected to the data-line metal layer 51 through the first via A, the second electrode 54 may be electrically connected to the gate-line metal layer 52 through the second via B, such that a capacitor is formed between the first electrode 53 and the second electrode 54.

The first via A penetrates through the resin layer 56 to expose the data-line metal layer 51 (alternatively, there may be a passivation layer between the resin layer 56 and the data-line metal layer 51, and in such a case, the first via A further penetrates through this passivation layer). The second via B penetrates through the passivation layer 57, the resin layer 56, and the gate-insulating layer 55 to expose the gate-line metal layer 52 (alternatively, there may be a passivation layer between the resin layer 56 and the gate-insulating layer 55, and in such a case, the second via B further penetrates through this passivation layer).

Figure 6:
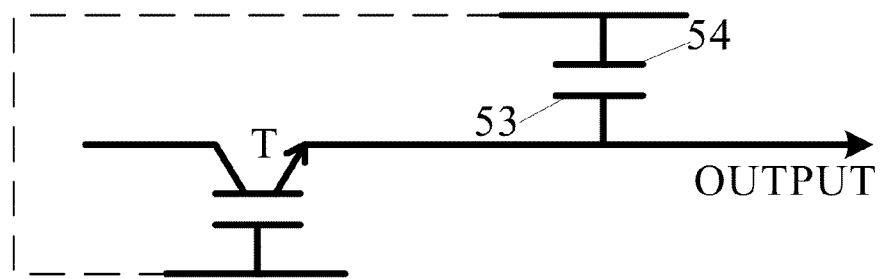
FIG. 6 is a schematic diagram illustrating the circuit structure of a capacitor area in a GOA circuit area in an array substrate according to an embodiment of the present invention.

The circuit structure of the capacitor in such a GOA circuit may be shown as in FIG. 6. Wherein, a transistor T is used for outputting a gate row-driving signal, the first electrode 53 and the second electrode 54 are respectively connected to a source and a gate of the transistor T, and a capacitor is formed between the first electrode 53 and the second electrode 54. Since it does not need to additionally provide a capacitor area, the length of the GOA circuit area is reduced effectively, and the width of a frame of a display device is further reduced.

It should be noted that, in the array substrate as shown in FIG. 5*a*, description has been made by taking the following as an example: the first electrode 53 is connected to a pixel electrode, and the second electrode 54 is connected to a common electrode. However, the present invention is not limited thereto. It can be conceivable that, in the array substrate according to an embodiment of the present invention, a configuration in which the first electrode 53 is connected to a common electrode and the second electrode 54 is connected to a pixel electrode may also be employed.

Figure 7:
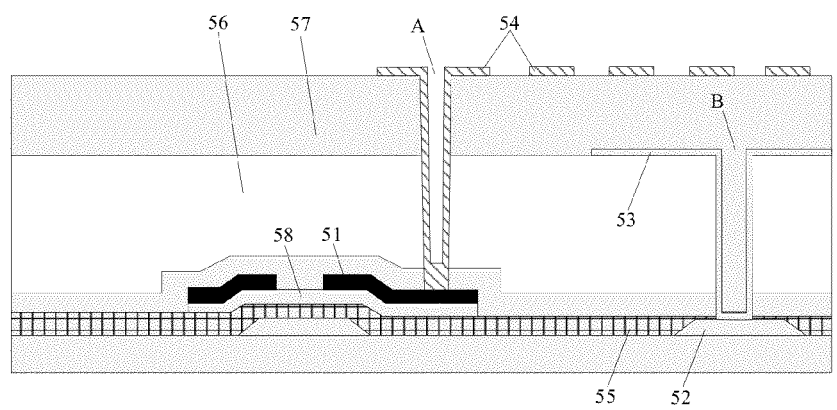
FIG. 7 is a schematic diagram illustrating the hierarchical structure of another array substrate according to an embodiment of the present invention.

An array substrate according to another embodiment of the present invention is shown in FIG. 7. In the array substrate as shown in FIG. 7, the first electrode 53 may be electrically connected to the gate-line metal layer 52 through the second via B, the second electrode 54 may be electrically connected to the data-line metal layer 51 through the first via A, such that a capacitor is formed between the first electrode 53 and the second electrode 54.

Wherein, the first via A penetrates through the passivation layer 57 and the resin layer 56 to expose the data-line metal layer 51, and the second via B penetrates through the resin layer 56 and the gate-insulating layer 55 to expose the gate-line metal layer 52.

Other aspects of the array substrate according to the present embodiment are the same as the corresponding aspects of the previous embodiment, and description thereof is omitted.

Similarly to the previous embodiment, in an array substrate with such a configuration, as compared to an existing GOA circuit, the GOA circuit used in this array substrate does not need to additionally provide a capacitor area. Thus, the length of the GOA circuit area is reduced effectively, and the width of a frame of a display device is further reduced.

Another embodiment of the present invention provides a display device including the array substrate as described above.

The array substrate particularly includes a GOA circuit area and a display area, the GOA circuit area includes a TFT area used for outputting a gate row-driving signal and a lead-wire area connected to the TFT area, and the display area includes a data line and a gate line which are arranged crosswise;

Wherein, the GOA circuit area is provided with at least one first via and at least one second via, a data-line metal layer is disposed at the bottom of the at least one first via, and a gate-line metal layer is disposed at the bottom of the at least one second via. The GOA circuit area further includes a first electrode and a second electrode, the data-line metal layer is electrically connected to one electrode of the first electrode and the second electrode through the at least one first via, and the gate-line metal layer is electrically connected to the other electrode of the first electrode and the second electrode through the at least one second via, such that a capacitor is formed between the first electrode and the second electrode. Furthermore, the first electrode and the second electrode may be arranged in the TFT area.

It should be noted that, the display device according to the present invention may be a product or component having any kind of display function, such as a liquid crystal panel, an electronic paper, an OLED panel, a liquid crystal TV, a liquid crystal display, a digital photo frame, a mobile phone, a tablet computer, and the like.

The display device according to the present embodiment enables a capacitor to be formed between the first electrode and the second electrode by the following technical measures: providing the at least one first via and the at least one second via in the GOA circuit area and providing the first electrode and the second electrode in the GOA circuit area, wherein the data-line metal layer of the TFT area is disposed at the bottom of the at least one first via, and the gate-line metal layer of the TFT area is disposed at the bottom of the at least one second via; the data-line metal layer is electrically connected to one electrode of the first electrode and the second electrode through the at least one first via, and the gate-line metal layer is electrically connected to the other electrode of the first electrode and the second electrode through the at least one second via. As compared to an existing GOA circuit, the GOA circuit employed in the array substrate having such a configuration does not need to additionally provide a capacitor area. Thus, the length of the GOA circuit area is reduced effectively, and the width of a frame of the display device is further reduced.

Another embodiment of the present invention provides a method for manufacturing an array substrate. The method is used for manufacturing the array substrate as described above. The array substrate includes a GOA circuit area and a display area, the GOA circuit area includes a TFT area used for outputting a gate row-driving signal and a lead-wire area connected to the TFT area, and the display area includes a data line and a gate line which are arranged crosswise; the GOA circuit area further includes a first electrode and a second electrode; furthermore, the first electrode and the second electrode may be arranged in the TFT area.

Figure 8:
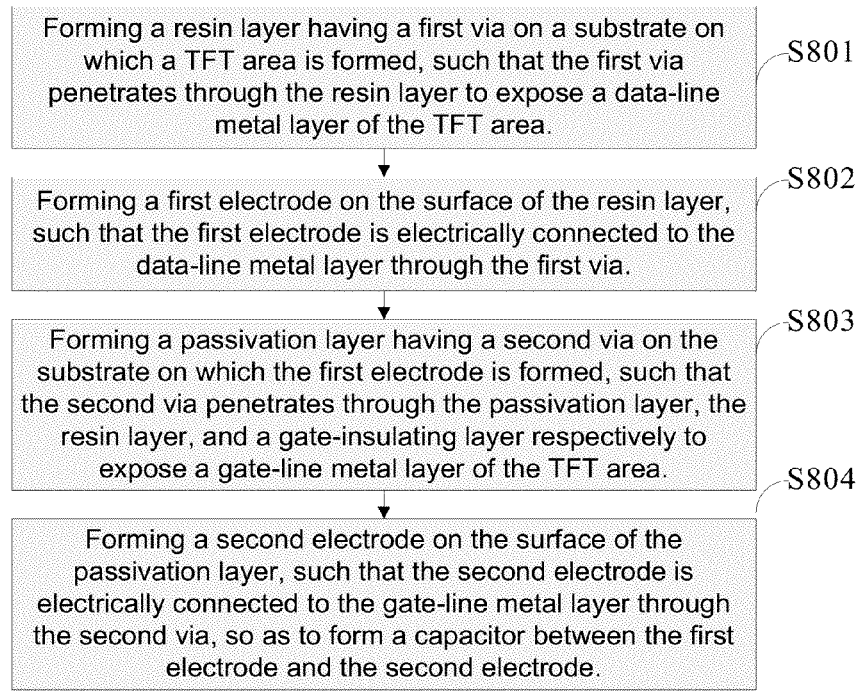
FIG. 8 is a flow chart illustrating a method for manufacturing an array substrate according to an embodiment of the present invention.

As shown in FIG. 8, the method includes the following steps:

S801: forming a resin layer having a first via on a substrate on which the TFT area is formed such that the first via penetrates through the resin layer to expose a data-line metal layer of the TFT area;

Specifically, the resin layer may be formed on a surface of the substrate, on which the TFT area is formed, by coating, then the first via is formed in the resin layer by a patterning process;

S802: forming a first electrode on the surface of the resin layer such that the first electrode is electrically connected to the data-line metal layer through the first via;

S803: forming a passivation layer having a second via on the substrate on which the first electrode is formed such that the second via penetrates through the passivation layer, the resin layer, and a gate-insulating layer of the TFT area to expose a gate-line metal layer of the TFT area;

Specifically, the passivation layer may be formed through preparing an insulating thin film on the substrate, on which the first electrode is formed, by chemical vapor deposition, thermal evaporation, or the like, and then the second via is formed in the passivation layer by a patterning process; wherein, a single-layer thin film of silicon nitride, silicon oxide or silicon nitride oxide may be used as the insulating thin film, or a multi-layer thin film formed of a plurality of layers of the above material may also be used as the insulating thin film; and S804: forming a second electrode on the surface of the passivation layer such that the second electrode is electrically connected to the gate-line metal layer through the second via to form a capacitor between the first electrode and the second electrode;

Wherein, both the first electrode and the second electrode may be formed of transparent metal oxide material which have semiconductor characteristics, examples of transparent metal oxide material may include at lest one of InGaZnO, InGaO, ITZO, and AlZnO.

The method for manufacturing an array substrate according to the present embodiment enables a capacitor to be formed between the first electrode and the second electrode by the following technical measures: providing the at least one first via and the at least one second via in the GOA circuit area, and providing the first electrode and the second electrode in the GOA circuit area, wherein the data-line metal layer of the TFT area is disposed at the bottom of the at least one first via, and the gate-line metal layer of the TFT area is disposed at the bottom of the at least one second via; the first electrode is electrically connected to the data-line metal layer through the at least one first via, and the second electrode is electrically connected to the gate-line metal layer through the at least one second via. As compared to an existing GOA circuit, the GOA circuit employed in the array substrate having such a configuration does not need to additionally provide a capacitor area due to the fact that a capacitor can be formed in the TFT area. Thus, the length of the GOA circuit area is reduced effectively, and the width of a frame of the display device is further reduced. It should be noted that, in the present embodiment, description has been made by taking the following as an example: the first electrode is connected to a pixel electrode, and the second electrode is connected to a common electrode.

Furthermore, a first transparent electrode and a second transparent electrode may be further provided in the display area. The first transparent electrode and the first electrode may be formed in the same layer by a single patterning process, and the second transparent electrode and the second electrode may be formed in the same layer by a single patterning process. Wherein, arrangement in the same layer is also relative to at least two patterns, and arrangement in the same layer of at least two patterns means that the at least two patterns are formed by performing a patterning process on the same thin film. In the present embodiment, the first transparent electrode may be a pixel electrode, and the second transparent electrode may be a common electrode.

A third electrode integrally formed with the first electrode and a fourth electrode integrally formed with the second electrode may be further arranged in the lead-wire area. A capacitor is formed between the third electrode and the fourth electrode in a manner similar to the above. Thus, by providing a capacitor in the lead-wire area additionally, it can be further ensured that capacitance parameter in the GOA circuit meets the design requirements without a specially provided capacitor area.

The configuration of the TFT area of the GOA circuit area in the array substrate manufactured by employing such a method for manufacturing an array substrate may be shown as in FIG. 5a, wherein the first electrode 53 is connected to a pixel electrode, and the second electrode 54 is connected to a common electrode. However, the present invention is not limited thereto. It can be conceivable that, in the array substrate according to the present embodiment, a configuration in which the first electrode 53 is connected to a common electrode and the second electrode 54 is connected to a pixel electrode may also be employed.

Another embodiment of the present invention further provides a method for manufacturing an array substrate. The method is used for manufacturing the array substrate as described above. The array substrate includes a GOA circuit area and a display area, the GOA circuit area includes a TFT area used for outputting a gate row-driving signal and a lead-wire area connected to the TFT area, and the display area includes a data line and a gate line which are arranged crosswise, the GOA circuit area further includes a first electrode and a second electrode; furthermore, the first electrode and the second electrode may be arranged in the TFT area.

Figure 9:
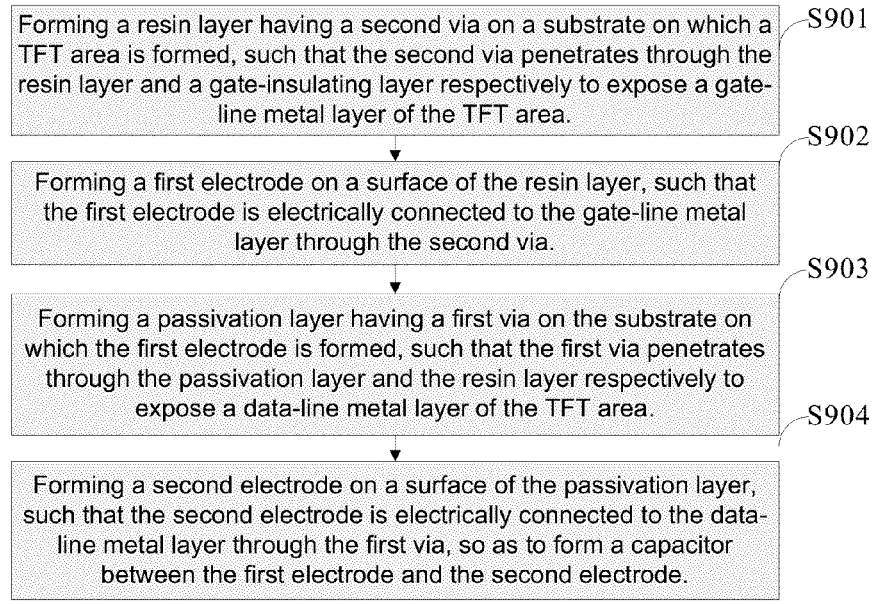
FIG. 9 is a flow chart illustrating another method for manufacturing an array substrate according to an embodiment of the present invention.

As shown in FIG. 9, the method includes the following steps:

S901: forming a resin layer having a second via on a substrate on which the TFT area is formed such that the second via penetrates through the resin layer and a gate-insulating layer of the TFT area to expose a gate-line metal layer of the TFT area;

Specifically, the resin layer may be formed on the surface of the substrate, on which the TFT area is formed, by coating, and then the second via is formed in the resin layer by a patterning process;

S902: forming a first electrode on the surface of the resin layer such that the first electrode is electrically connected to the gate-line metal layer through the second via;

S903: forming a passivation layer having a first via on the substrate on which the first electrode is formed such that the first via penetrates through the passivation layer and the resin layer to expose a data-line metal layer of the TFT area:

Specifically, the passivation layer may be formed through preparing an insulating thin film on the substrate, on which the first electrode is formed, by chemical vapor deposition, thermal evaporation, or the like, and then the first via is formed in the passivation layer by a patter process: wherein a single-layer thin film of silicon nitride, silicon oxide or silicon nitride oxide may be used as the insulating thin film, or a multi-layer thin film formed of a plurality of layers of the above material may also be used as the insulating thin film; and S904: forming a second electrode on the surface of the passivation layer such that the second electrode is electrically connected to the data-line metal layer through the first via to form a capacitor between the first electrode and the second electrode;

Wherein, both the first electrode and the second electrode may be formed of transparent metal oxide material which has semiconductor characteristics, examples of transparent metal oxide material may include at lest one of InGaZnO, InGaO, ITZO, and AlZnO.

The method for manufacturing an array substrate according to the present embodiment enables a capacitor to be formed between the first electrode and the second electrode by the following technical measures: providing the at least one first via and the at least one second via in the GOA circuit area, and providing the first electrode and the second electrode in the GOA circuit area, wherein the data-line metal layer of the TFT area is disposed at the bottom of the at least one first via, and the gate-line metal layer of the TFT area is disposed at the bottom of the at least one second via: the second electrode is electrically connected to the data-line metal layer through the at least one first via, and the first electrode is electrically connected to the gate-line metal layer through the at least one second via. As compared to an existing GOA circuit, the GOA circuit employed in the array substrate having such a configuration does not need to additionally provide a capacitor area. Thus, the length of the GOA circuit area is reduced effectively, and the width of a frame of the display device is further reduced.

It should be noted that, in the present embodiment, description has been made by taking the following as an example: the first electrode and the second electrode are arranged in the TFT area. Alternatively, the first electrode and the second electrode may be arranged in the lead-wire area, or may be arranged in both the TFT area and the lead-wire area. Furthermore, the present embodiment has been described by taking the following as an example: the first electrode is connected to a common electrode, and the second electrode is connected to a pixel electrode.

Furthermore, a first transparent electrode and a second transparent electrode may be further provided in the display area. The first transparent electrode and the first electrode may be formed in the same layer by a single patterning process, and the second transparent electrode and the second electrode may be formed in the same layer by a single patterning process. Wherein, arrangement in the same layer is also relative to at least two patterns, and arrangement in the same layer of at least two patterns means that the at least two patterns are formed by performing a patterning process on the same thin film. In the present embodiment, the first transparent electrode may be a common electrode, and the second transparent electrode may be a pixel electrode.

A third electrode integrally formed with the first electrode and a fourth electrode integrally formed with the second electrode may be further arranged in the lead-wire area. A capacitor is formed between the third electrode and the fourth electrode. Thus, by providing a capacitor in the lead-wire area additionally, it can be further ensured that capacitance parameter in the GOA circuit meets the design requirements without a specially provided capacitor area.

The configuration of the TFT area of the GOA circuit in the array substrate manufactured by employing such a method for manufacturing an array substrate may be shown as in FIG. 7, wherein the first electrode 53 is connected to a common electrode, and the second electrode 54 is connected to a pixel electrode. As compared to an existing GOA circuit, the GOA circuit employed in the array substrate having such a configuration does not need to additionally provide a capacitor area. Thus, the length of the GOA circuit area is reduced effectively, and the width of a frame of the display device is further reduced.

The foregoing are only exemplary embodiments of the present invention, and the protection scope of the present invention is not limited thereto. Modifications and variations easily conceived by a person skilled in the art without departing from the technical scope disclosed by the present invention all fall within the protection range of the present invention. Therefore, the protection scope of the present invention is defined by the claims.

What is claimed is:

1. An array substrate including a gate driver on array (GOA) circuit area which includes a thin film transistor (TFT) area for outputting a gate row-driving signal and a lead-wire area connected to the TFT area, and a display area which includes a data line and a gate line which are arranged crosswise; wherein
    the GOA circuit area is provided with at least one first via and at least one second via, a data-line metal layer is disposed at the bottom of the at least one first via, and a gate-line metal layer is disposed at the bottom of the at least one second via;
the GOA circuit area further includes a first electrode and a second electrode, the data-line metal layer is electrically connected to one electrode of the first electrode and the second electrode through the at least one first via, the gate-line metal layer is electrically connected to the other electrode of the first electrode and the second electrode through the at least one second via, such that a capacitor is formed between the first electrode and the second electrode, wherein
    the first electrode is connected to a pixel electrode, and the second electrode is connected to a common electrode; or
    the first electrode is connected to a common electrode, and the second electrode is connected to a pixel electrode.

2. The array substrate according to claim 1, wherein the display area is further provided with a first transparent electrode and a second transparent electrode, the first transparent electrode and the first electrode are formed in the same layer by a single patterning process, and the second transparent electrode and the second electrode are formed in the same layer by using a single patterning process.

3. The array substrate according to claim 1, wherein the lead-wire area further includes:
    a third electrode integrally formed with the first electrode and a fourth electrode integrally formed with the second electrode, and a capacitor is formed between the third electrode and the fourth electrode.

4. The array substrate according to claim 1, wherein the TFT area further includes:
    a gate-insulating layer and a semiconductor active layer which are between the gate-line metal layer and the data-line metal layer;
    a resin layer between the data-line metal layer and the first electrode; and
    a passivation layer between the first electrode and the second electrode.

5. The array substrate according to claim 4, wherein
    the at least one first via penetrates through the resin layer to expose the data-line metal layer, and the at least one second via penetrates through the passivation layer, the resin layer, and the gate-insulating layer to expose the gate-line metal layer; or the at least one first via penetrates through the passivation layer and the resin layer to expose the data-line metal layer, and the at least one second via penetrates through the resin layer and the gate-insulating layer to expose the gate-line metal layer.

6. A display device including an array substrate, the array substrate includes a gate driver on array (GOA) circuit area which includes a thin film transistor (TFT) area for outputting a gate row-driving signal and a lead-wire area connected to the TFT area, and a display area which includes a data line and a gate line which are arranged crosswise; wherein
    the GOA circuit area is provided with at least one first via and at least one second via, a data-line metal layer is disposed at the bottom of the at least one first via, and a gate-line metal layer is disposed at the bottom of the at least one second via;
the GOA circuit area further includes a first electrode and a second electrode, the data-line metal layer is electrically connected to one electrode of the first electrode and the second electrode through the at least one first via, the gate-line metal layer is electrically connected to the other electrode of the first electrode and the second electrode through the at least one second via, such that a capacitor is formed between the first electrode and the second electrode, wherein
    the first electrode is connected to a pixel electrode, and the second electrode is connected to a common electrode; or
    the first electrode is connected to a common electrode, and the second electrode is connected to a pixel electrode.

7. The display device according to claim 6, wherein the display area is further provided with a first transparent electrode and a second transparent electrode, the first transparent electrode and the first electrode are formed in the same layer by a single patterning process, and the second transparent electrode and the second electrode are formed in the same layer by using a single patterning process.

8. The display device according to claim 6, wherein the lead-wire area further includes:
    a third electrode integrally formed with the first electrode and a fourth electrode integrally formed with the second electrode, and a capacitor is formed between the third electrode and the fourth electrode.

9. The display device according to claim 6, wherein the TFT area further includes:
    a gate-insulating layer and a semiconductor active layer which are between the gate-line metal layer and the data-line metal layer;

a resin layer between the data-line metal layer and the first electrode; and a passivation layer between the first electrode and the second electrode.

10. The display device according to claim 9, wherein the at least one first via penetrates through the resin layer to expose the data-line metal layer, and the at least one second via penetrates through the passivation layer, the resin layer, and the gate-insulating layer to expose the gate-line metal layer; or the at least one first via penetrates through the passivation layer and the resin layer to expose the data-line metal layer, and the at least one second via penetrates through the resin layer and the gate-insulating layer to expose the gate-line metal layer.

* * * * *